(12) United States Patent
Kibi et al.

(10) Patent No.: US 12,100,616 B2
(45) Date of Patent: Sep. 24, 2024

(54) METHOD OF MANUFACTURING SEMICONDUCTOR DEVICE

(71) Applicant: Tokyo Electron Limited, Tokyo (JP)

(72) Inventors: Kazuo Kibi, Tokyo (JP); Shigetsugu Fujita, Tokyo (JP); Kenji Suzuki, Nirasaki (JP); Mitsuhiro Okada, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 419 days.

(21) Appl. No.: 17/445,436

(22) Filed: Aug. 19, 2021

(65) Prior Publication Data

US 2021/0384071 A1 Dec. 9, 2021

Related U.S. Application Data

(63) Continuation of application No. PCT/JP2020/004898, filed on Feb. 7, 2020.

(30) Foreign Application Priority Data

Feb. 20, 2019 (JP) .................................. 2019-027948

(51) Int. Cl.
*H01L 21/768* (2006.01)
*H01L 21/027* (2006.01)

(52) U.S. Cl.
CPC .... *H01L 21/76805* (2013.01); *H01L 21/0274* (2013.01); *H01L 21/76877* (2013.01)

(58) Field of Classification Search
None
See application file for complete search history.

(56) References Cited

U.S. PATENT DOCUMENTS

| | | | | |
|---|---|---|---|---|
| 6,611,014 B1* | 8/2003 | Kanaya | ................... | H10B 53/30 |
| | | | | 257/295 |
| 2004/0197990 A1 | 10/2004 | Hieda | | |
| 2009/0017629 A1 | 1/2009 | Jang | | |
| 2015/0041888 A1* | 2/2015 | Kim | ................... | H10B 12/0335 |
| | | | | 257/330 |
| 2018/0040561 A1 | 2/2018 | Kim et al. | | |
| 2020/0089098 A1* | 3/2020 | Wang | ........................ | G03F 1/36 |

FOREIGN PATENT DOCUMENTS

| | | | |
|---|---|---|---|
| JP | 2000294636 A | * | 10/2000 |
| JP | 2002151435 A | * | 5/2002 |
| JP | 2004-311706 A | | 11/2004 |
| JP | 2009-021598 A | | 1/2009 |
| KR | 10-2016-0140448 A | | 12/2016 |
| KR | 10-2017-0026052 A | | 3/2017 |

* cited by examiner

*Primary Examiner* — Michael Lebentritt
(74) *Attorney, Agent, or Firm* — Armstrong Teasdale LLP

(57) ABSTRACT

A method of manufacturing a semiconductor device includes: planarizing a surface of a substrate having a conductive material embedded in a first hole so as to expose the conductive material embedded in the first hole, wherein the first hole is formed in a region which is on an insulating film laminated on the substrate and is surrounded by a spacer film; laminating a mask film on the surface of the substrate; forming a second hole in the mask film such that at least a portion of an upper surface of the conductive material embedded in the first hole is exposed; embedding the conductive material in the second hole; and removing the mask film.

7 Claims, 12 Drawing Sheets

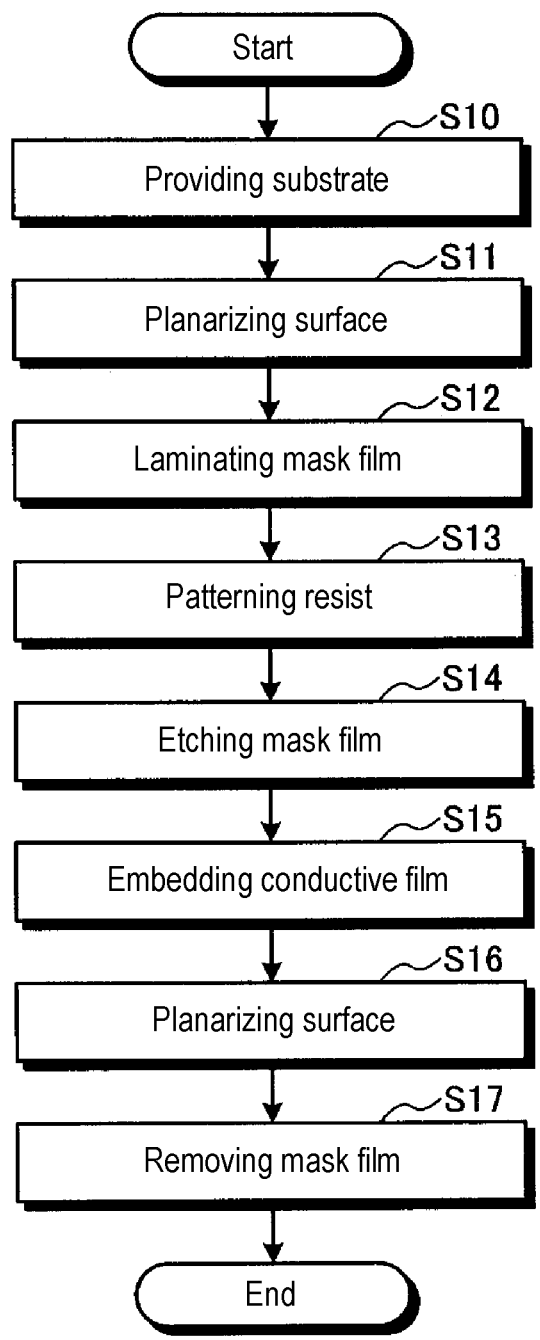

METHOD OF MANUFACTURING SEMICONDUCTOR DEVICE

CROSS-REFERENCE TO RELATED APPLICATIONS

This application is a bypass continuation application of international application No. PCT/JP2020/004898 having an international filing date of Feb. 7, 2020 and designating the United States, the international application being based upon and claiming the benefit of priority from Japanese Patent Application No. 2019-027948, filed on Feb. 20, 2019, the entire contents of which are incorporated herein by reference.

TECHNICAL FIELD

Various aspects and embodiments of the present disclosure relate to a method of manufacturing a semiconductor device.

BACKGROUND

For example, Patent Document 1 below discloses forming a contact pad on a contact plug for connecting a capacitor and a diffusion layer to each other in a process of manufacturing a semiconductor device such as a dynamic random access memory (DRAM). The contact pad is capable of absorbing a misalignment of a groove caused due to processing performed to form the groove constituting the capacitor.

PRIOR ART DOCUMENTS

Patent Documents

Patent Document 1: U.S. Patent Application Publication No. 2018/0040561

SUMMARY

As one aspect of the present disclosure, there is provided a method of manufacturing a semiconductor device including: planarizing a surface of a substrate having a conductive material embedded in a first hole so as to expose the conductive material embedded in the first hole, wherein the first hole is formed in a region which is on an insulating film laminated on the substrate and is surrounded by a spacer film; laminating a mask film on the surface of the substrate; forming a second hole in the mask film such that at least a portion of an upper surface of the conductive material embedded in the first hole is exposed; embedding the conductive material in the second hole; and removing the mask film.

BRIEF DESCRIPTION OF DRAWINGS

The accompanying drawings, which are incorporated in and constitute a portion of the specification, illustrate embodiments of the present disclosure, and together with the general description given above and the detailed description of the embodiments given below, serve to explain the principles of the present disclosure.

FIG. 1 is a flowchart illustrating an example of a semiconductor device manufacturing method according to an embodiment of the present disclosure.

DETAILED DESCRIPTION

Figure 2A:
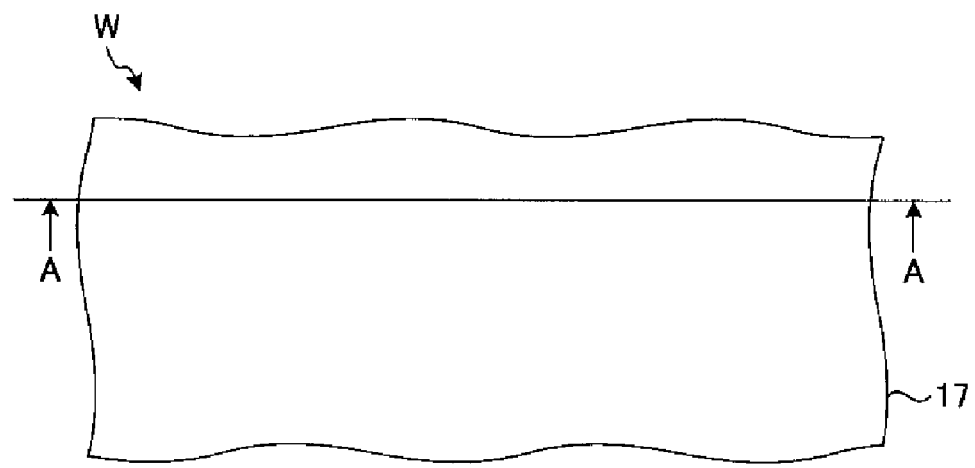
FIG. 2A is a top view illustrating an example of a wafer used for manufacturing a semiconductor device according to an embodiment of the present disclosure.

Hereinafter, embodiments of a semiconductor device manufacturing method disclosed herein will be described in detail with reference to the drawings. The semiconductor device manufacturing method disclosed herein is not limited by the following embodiments. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In a conventional method of manufacturing a contact pad of a semiconductor device such as a DRAM, the contact pad is formed by etching a conductive material laminated on a contact plug. In this case, since a portion other than the conductive material to be left as the contact pad is removed through etching, finer processing is required. When the contact pad is formed through etching, for example, a resist patterned by negative tone development (NTD) using, for example, extreme ultraviolet lithography (EUV) light, is used.

A resist material used for NTD using EUV light contains a metal. Therefore, an exposure time of the resist material is longer than that of a resist material that does not contain a metal. When the exposure time becomes long, the productivity of the semiconductor device decreases.

In addition, when etching away the portion other than the conductive material to be left as the contact pad, the conductive material is etched using a mask film on which a resist pattern is transferred as a mask. However, since the selectivity of the mask film to the conductive material is not so high, it is necessary to make the mask film thicker. Therefore, it is difficult to etch the mask film with high accuracy.

In addition, when etching away the portion other than the conductive material to be left as the contact pad, a portion of the contact plug may also be removed at the same time. This makes the contact plug thinner, which results in an increase in resistance value of the contact plug. When the resistance value of the contact plug increases, the delay of a signal flowing through the contact plug increases.

Therefore, the present disclosure provides a technique capable of processing a semiconductor device having a small signal delay with high accuracy and capable of improving the productivity of the semiconductor device.

[Semiconductor Device Manufacturing Method]

FIG. 1 is a flowchart illustrating an example of a semiconductor device manufacturing method according to an embodiment of the present disclosure. In the present embodiment, a wafer W used for manufacturing a semiconductor device is manufactured through a procedure illustrated in the flowchart of FIG. 1. Hereinafter, the example of the semiconductor device manufacturing method will be described with reference to FIGS. 2A to 7B.

Figure 2B:
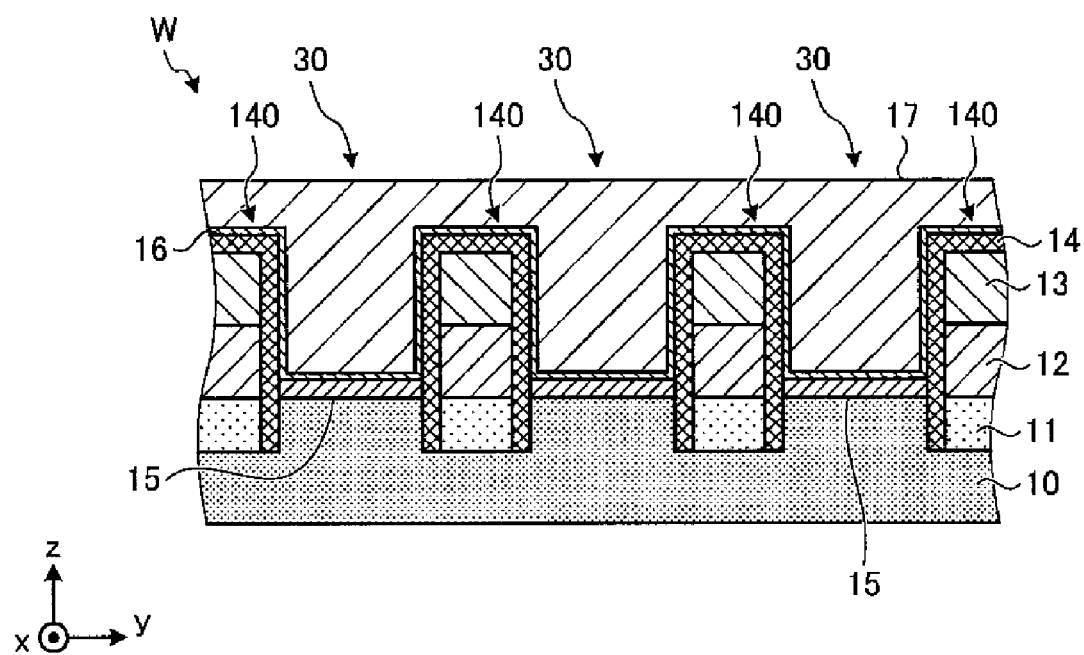
FIG. 2B is a cross-sectional view taken along line A-A, illustrating an example of the wafer used for manufacturing a semiconductor device according to an embodiment of the present disclosure.

First, the wafer W to be processed is provided (S10). The wafer W to be processed has, for example, a structure as illustrated in FIGS. 2A and 2B. FIG. 2A is a top view illustrating an example of the wafer W used for manufacturing a semiconductor device according to an embodiment of the present disclosure, and FIG. 2B is a cross-sectional view taken along line A-A in FIG. 2A.

For example, the wafer W illustrated in FIGS. 2A and 2B has a semiconductor substrate 10, which is a semiconductor, such as silicon, into which a p-type impurity is introduced. A contact 11 made of polycrystalline silicon or the like is formed on a surface of the semiconductor substrate 10. An electrode film 12 of tungsten or the like is laminated on the contact 11. An insulating film 13 of silicon nitride or the like is laminated on the electrode film 12.

The contact 11, the electrode film 12, and the insulating film 13 are covered with a spacer 14. The spacer 14 has, for example, a structure in which a silicon oxide film is sandwiched between silicon nitride films. Structures 140, each having the contact 11, the electrode film 12, and the insulating film 13 covered with the spacer 14, are arranged at a predetermined interval in the y-axis direction, and each of the structures 140 extends in the x-axis direction.

In addition, an insulating film 13 is embedded in a recess between the structures 140 adjacent to each other in the y-axis direction. Holes 30 are formed in the insulating film 13 at predetermined intervals in the x-axis direction. Each hole 30 is an example of a first hole. In the holes 30, a metal film 15 of cobalt silicide or the like is laminated on the semiconductor substrate 10. In addition, each structure 140 and hole 30 is covered with a barrier film 16 of titanium nitride or the like.

The barrier film 16 is laminated through, for example, an atomic layer deposition (ALD) method. For example, the temperature of the wafer W is controlled to 200 degrees C. to 600 degrees C., and a tetrakis(dimethylamino)titanium (TDMAT) gas and a $NH_3$ gas are alternately supplied to the surface of the wafer W, whereby the barrier film 16 having a thickness of, for example, 0.5 nm to 2.0 nm is laminated. In some embodiments, the barrier film 16 may be laminated through a chemical vapor deposition (CVD) method. The barrier film 16 may be tantalum nitride or the like instead of the titanium nitride.

Then, a conductive material 17 is laminated on the surface of the wafer W. The conductive material 17 is embedded in each hole 30. In this embodiment, the conductive material 17 is, for example, tungsten. The conductive material 17 is laminated through, for example, a CVD method. For example, the temperature of the wafer W is controlled to 300 degrees C. to 600 degrees C., and a mixed gas of a $WF_6$ gas, a $SiH_4$ gas, and an Ar gas is supplied to the surface of the wafer W, whereby the conductive material 17 having a thickness of, for example, 10 nm to 30 nm is laminated on the wafer W. In some embodiments, the conductive material 17 may be laminated through an ALD method. In addition, as a raw material gas, a $WCl_4$ gas or the like may be used instead of the $WF_6$ gas, and a $H_2$ gas, a $CH_4$ gas, or the like may be used instead of the $SiH_4$ gas.

Figure 3A:
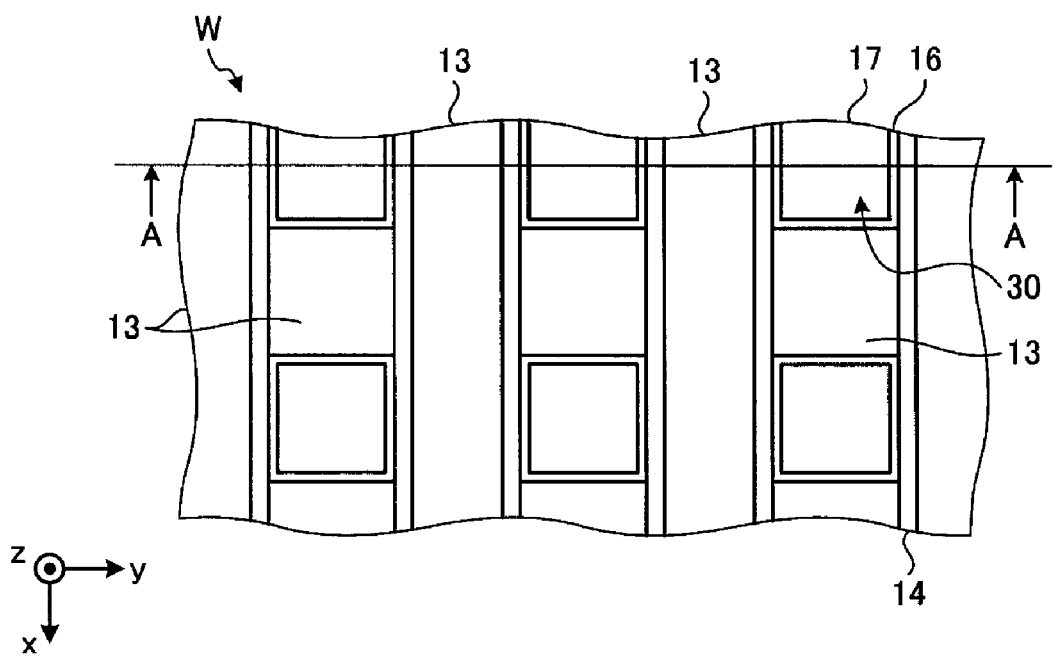
FIG. 3A is a top view illustrating an example of a wafer used for manufacturing a semiconductor device according to an embodiment of the present disclosure.
Figure 3B:
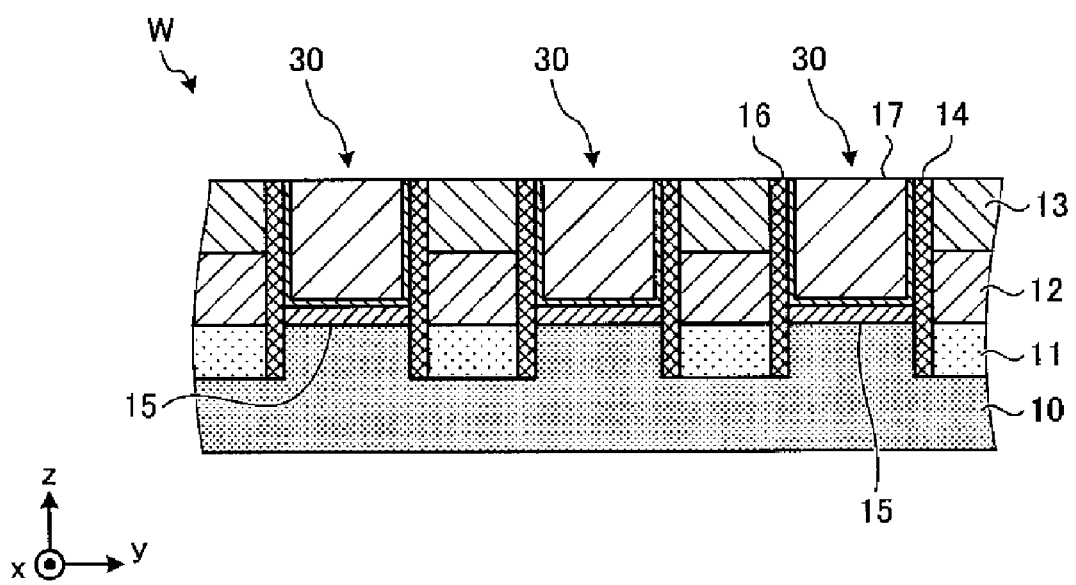
FIG. 3B is a cross-sectional view taken along line A-A, illustrating an example of the wafer used for manufacturing a semiconductor device according to an embodiment of the present disclosure.

Subsequently, the surface of the wafer W is planarized through chemical mechanical polishing (CMP) or the like (S11). Step S11 is an example of a planarizing step. As a result, for example, as illustrated in FIGS. 3A and 3B, the conductive material 17 on the upper surface of the wafer W is removed so that the conductive material 17 embedded in each hole 30 is exposed. In addition to the conductive material 17, the insulating film 13, the spacer 14, and the barrier film 16 are also exposed on the upper surface of the wafer W. FIG. 3A is a top view illustrating an example of the wafer W used for manufacturing a semiconductor device according to an embodiment of the present disclosure, and FIG. 3B is a cross-sectional view taken along line A-A in FIG. 3A.

Figure 4A:
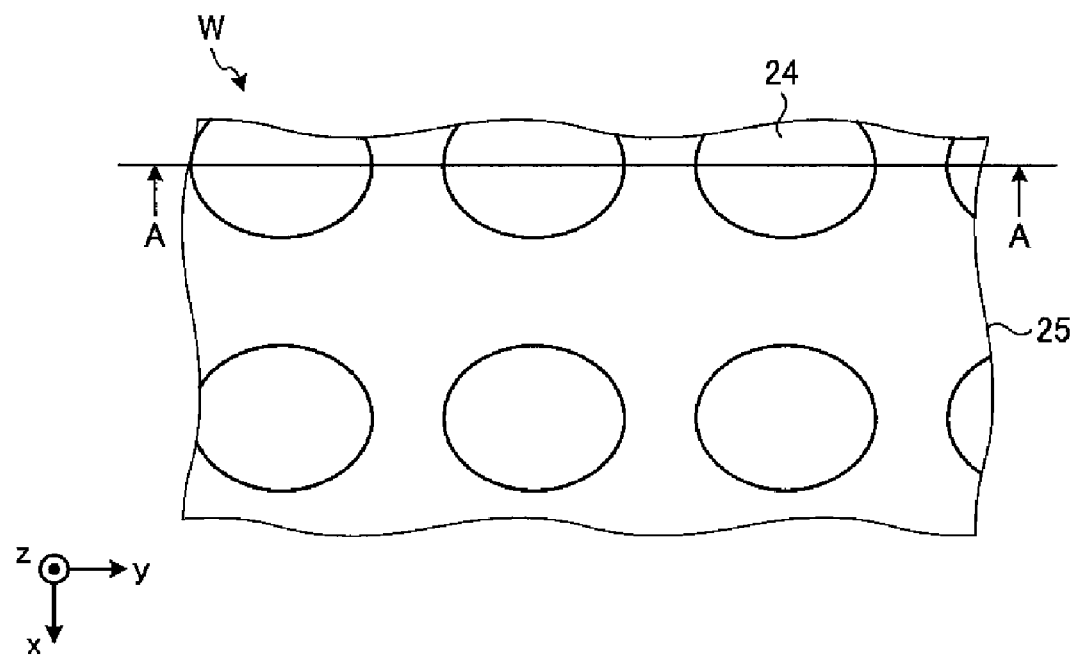
FIG. 4A is a top view illustrating an example of a wafer used for manufacturing a semiconductor device according to an embodiment of the present disclosure.
Figure 4B:
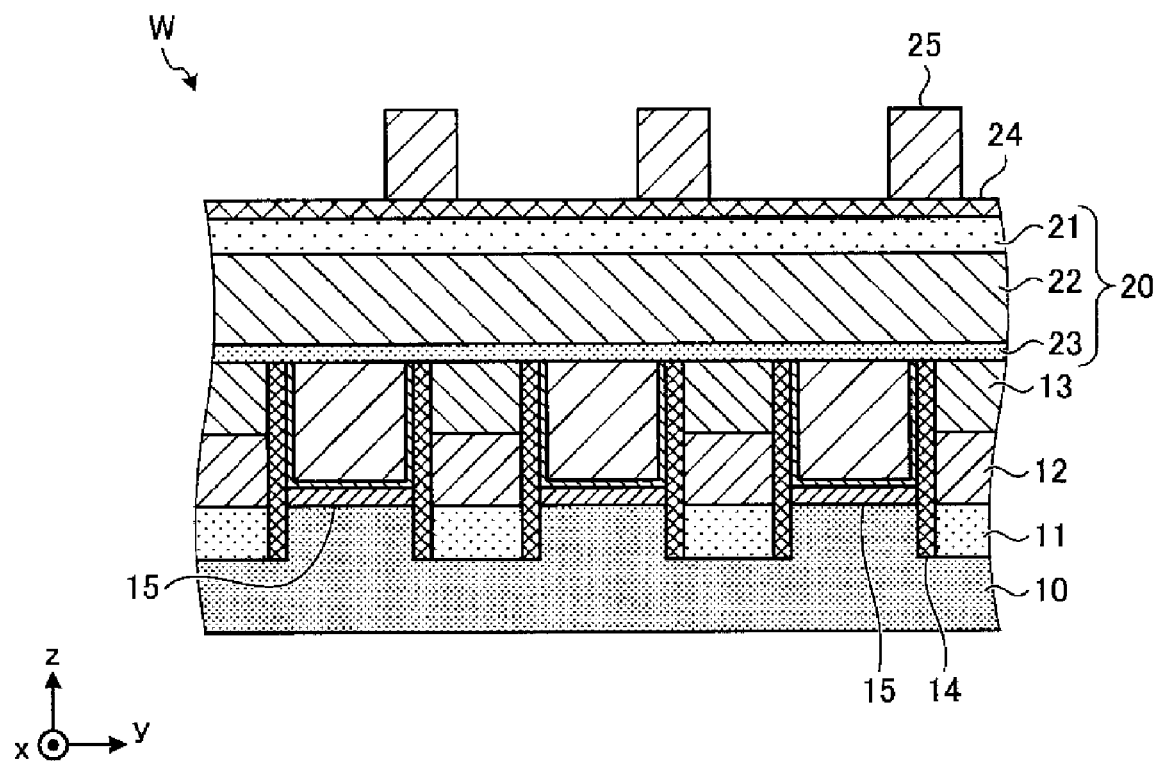
FIG. 4B is a cross-sectional view taken along line A-A, illustrating an example of the wafer used for manufacturing a semiconductor device according to an embodiment of the present disclosure.

Subsequently, a mask film 20 is laminated on the wafer W (S12). Step S12 is an example of a laminating step. Then, an antireflection film 24 is laminated on the mask film 20, and a resist 25 is laminated on the antireflection film 24. The antireflection film 24 is, for example, a silicon oxynitride film. The resist 25 is a material used for positive tone development (PTD) using EUV light, and is made of a metal-free material. Then, for example, as illustrated in FIGS. 4A and 4B, the resist 25 is patterned through PTD using EUV light (S13). FIG. 4A is a top view illustrating an example of the wafer W used for manufacturing a semiconductor device according to an embodiment of the present disclosure, and FIG. 4B is a cross-sectional view taken along line A-A in FIG. 4A.

In the present embodiment, the mask film 20 includes a first mask film 21, a second mask film 22, and an etching stop film 23. The first mask film 21 is, for example, a spin-on-carbon (SOC) film. The second mask film 22 is, for example, a silicon oxide film. The etching stop film 23 is, for example, polycrystalline silicon. In addition, in the present embodiment, for example, as illustrated in FIGS. 4A and 4B, a portion of the resist 25 is removed through PTD using EUV light, and openings in conformity to the shape of contact pads are formed.

Figure 5A:
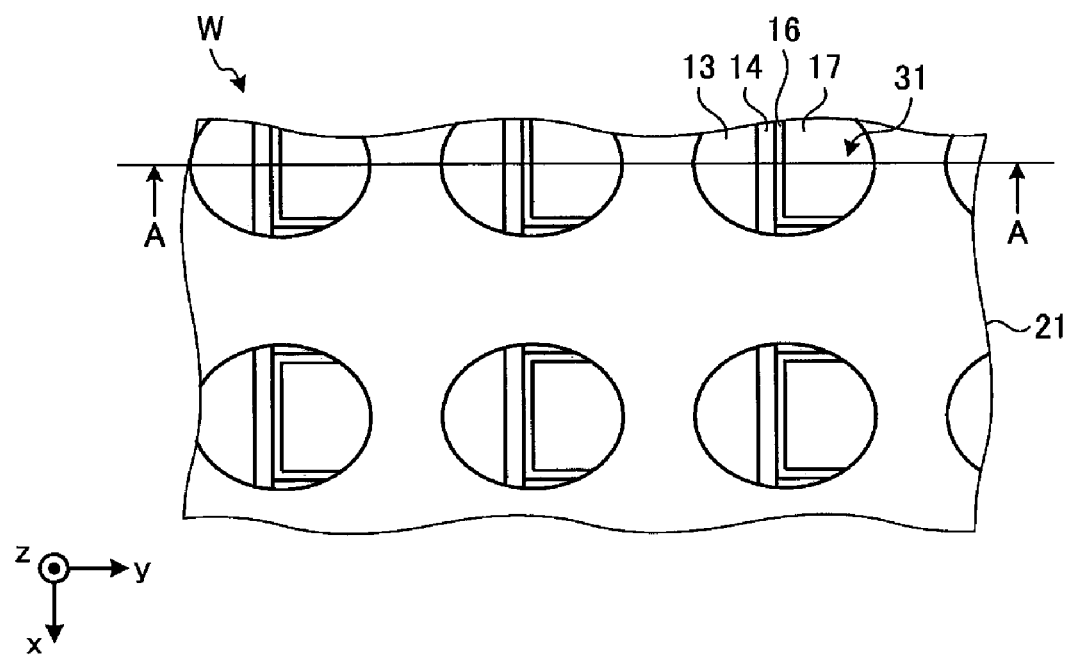
FIG. 5A is a top view illustrating an example of a wafer used for manufacturing a semiconductor device according to an embodiment of the present disclosure.
Figure 5B:
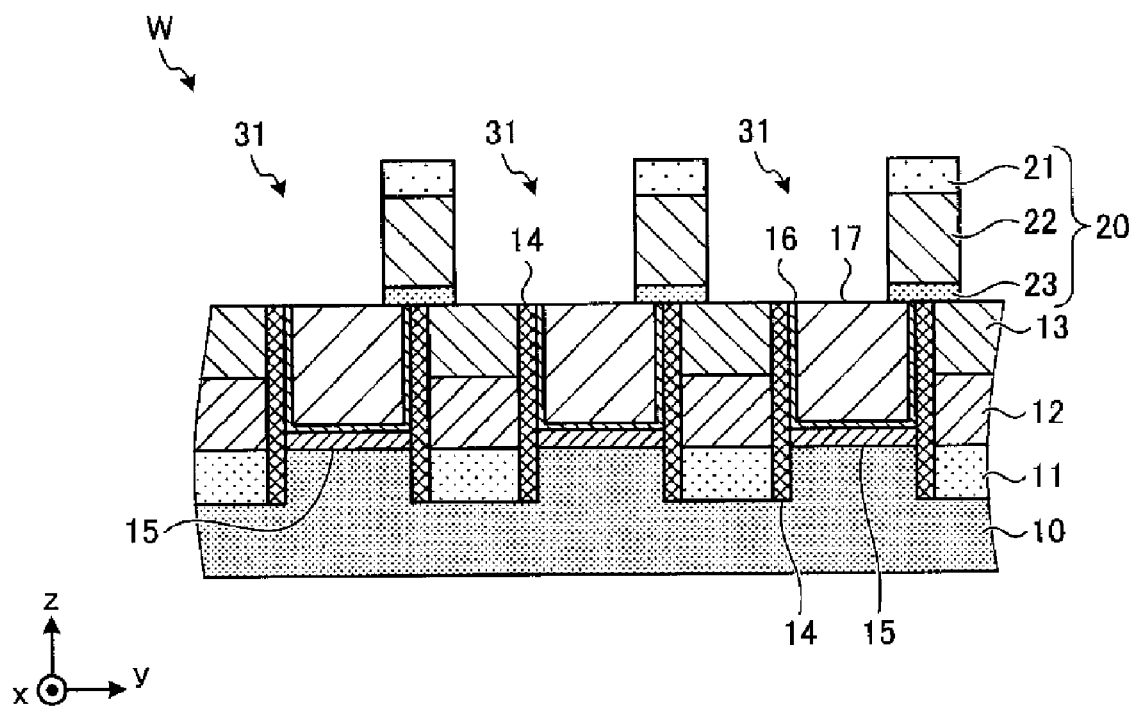
FIG. 5B is a cross-sectional view taken along line A-A, illustrating an example of the wafer used for manufacturing a semiconductor device according to an embodiment of the present disclosure.

Subsequently, the mask film 20 is etched using the resist 25 as a mask (S14). Then, the antireflection film 24 and the resist 25 are removed through ashing or the like. Steps S12 to S14 are examples of a hole forming step. As a result, for example, as illustrated in FIGS. 5A and 5B, holes 31 are formed in the mask film 20 in conformity to the shape of the resist 25, and a portion of the conductive material 17 underlying the mask film 20 is exposed through the holes 31. FIG. 5A is a top view illustrating an example of the wafer W used for manufacturing a semiconductor device according to an embodiment of the present disclosure, and FIG. 5B is a cross-sectional view taken along line A-A in FIG. 5A. Each hole 31 is an example of a second hole.

The etching of the first mask film 21, the second mask film 22, and the etching stop film 23 are performed through, for example, a dry etching method using plasma. In the etching of the first mask film 21, for example, the temperature of the wafer W is controlled to 100 degrees to 350 degrees C., and plasma of a CO gas is generated in the plasma processing apparatus, into which the wafer W is loaded, for, for example, 20 to 60 seconds. As the etching gas, for example, a gas containing a nitrogen atom or a hydrogen atom, or a mixed gas containing two or more kinds of gases selected from this gas group may be used instead of the CO gas.

In the etching of the second mask film 22, for example, the temperature of the wafer W is controlled to 20 degrees to 100 degrees C., and plasma of a $C_4F_8$ gas is generated in the plasma processing apparatus, into which the wafer W is loaded, for, for example, 5 to 60 seconds. As the etching gas, for example, a $CF_2$ gas, a $CF_3$ gas, a $C_2F_2$ gas, a $C_2F_4$ gas, a $C_2F_6$ gas, an Ar gas, a $CHF_3$ gas, an $O_2$ gas, or an $O_3$ gas), or a mixed gas containing two or more gases selected from a group of these gases, may be used instead of the $C_4F_8$ gas.

In the etching of the etching stop film 23, the temperature of the wafer W is controlled to for example, 20 degrees C. to 120 degrees C., and plasma of a mixed gas of a $Cl_2$ gas and a HBr gas is generated in the plasma processing apparatus, into which the wafer W is loaded for, for example, 5 to 300 seconds. As the etching gas, for example, a $SF_6$ gas may be used instead of the mixed gas of the $Cl_2$ gas and the HBr gas.

In addition, as a plasma source in the etching of the first mask film 21, the second mask film 22, and the etching stop film 23, for example, a source of capacitively coupled plasma (CCP), inductively coupled plasma (ICP), microwave excitation surface wave plasma (SWP), electron cyclotron resonance plasma (ECRP), helicon wave excitation plasma (HWP), or the like, may be used.

Figure 6A:
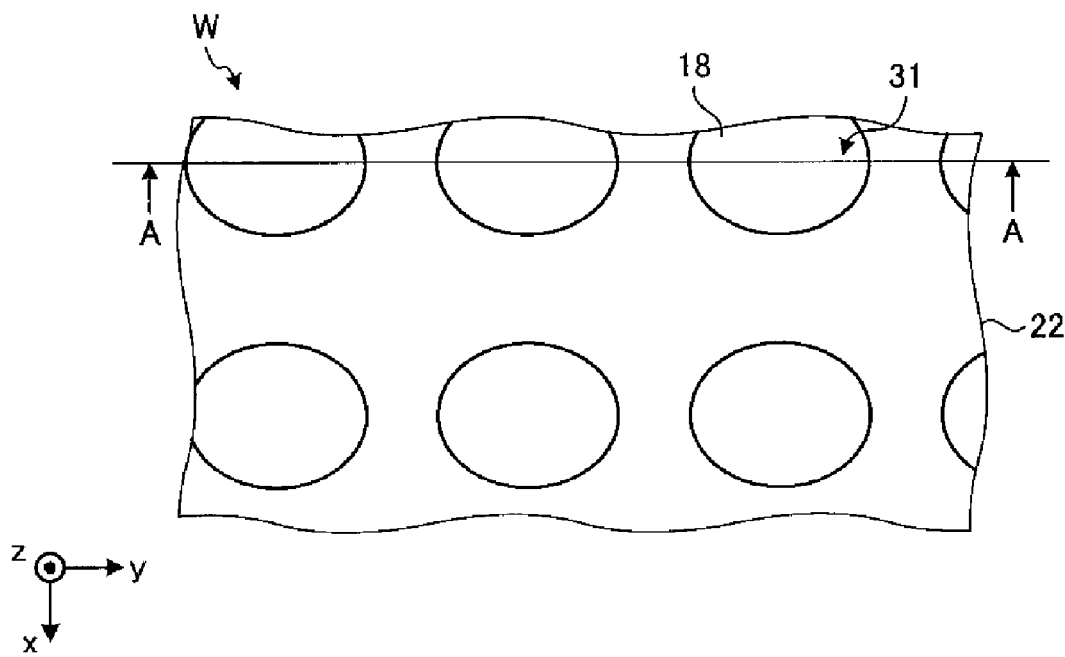
FIG. 6A is a top view illustrating an example of a wafer used for manufacturing a semiconductor device according to an embodiment of the present disclosure.
Figure 6B:
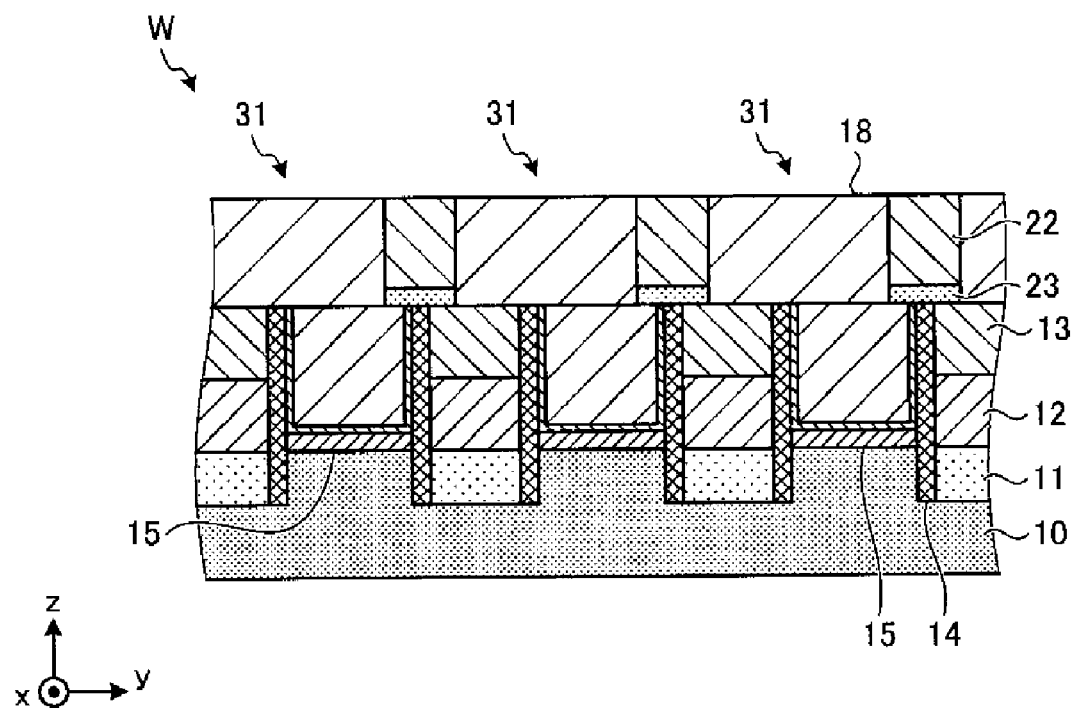
FIG. 6B is a cross-sectional view taken along line A-A, illustrating an example of the wafer used for manufacturing a semiconductor device according to an embodiment of the present disclosure.

Subsequently, a conductive material 18 is embedded in each hole 31 formed in the mask film 20 (S15). Step S15 is an example of an embedding step. As a result, the conductive material 18 is embedded in each hole 31, for example, as illustrated in FIGS. 6A and 6B. FIG. 6A is a top view illustrating an example of the wafer W used for manufacturing a semiconductor device according to an embodiment of the present disclosure, and FIG. 6B is a cross-sectional view taken along line A-A in FIG. 6A. The conductive material 18 is equal to the conductive material 17, and is, for example, tungsten. In step S15, the conductive material 18 is laminated through selective growth. As a result, the conductive material 18 is laminated on the barrier film 16 and the conductive material 17 in each hole 31, but is not laminated on the second mask film 22 and the insulating film 13 in each hole 31.

The conductive material 18 is selectively laminated on the conductive material 17 in each hole 31 through, for example, a method of alternately repeating a CVD method and a dry etching method using plasma. For example, the temperature of the wafer W is controlled to, for example, 450 degrees C. to 550 degrees C., the CVD method using a $WCl_5$ gas is performed for a predetermined period of time, and then the dry etching method using plasma of a $H_2$ gas is performed for a predetermined period of time. An amount of the $WCl_5$ gas supplied in the CVD method is, for example, 50 to 500 mg/min. In addition, a flow rate of the $H_2$ gas in the dry etching method is, for example, 1,000 to 9,000 sccm. A time length of one cycle including one round of CVD method and one round of dry etching method is, for example, 0.2 seconds to 10 seconds. A ratio of a period of the CVD method to a period of the dry etching method in one cycle is, for example, 1:1. In the lamination of the conductive material 18 of the present embodiment, the cycle including one round of CVD method and one round of dry etching method is repeated, for example, about several hundred times.

As the raw material gas in the CVD method, a $WCl_6$ gas, a $WF_6$ gas, or the like may be used instead of the $WCl_5$ gas. In addition, as the etching gas in the dry etching method, a $SiH_4$ gas or the like may be used instead of the $H_2$ gas. In addition, as the plasma source in the dry etching, for example, a source of capacitively coupled plasma (CCP), inductively coupled plasma (ICP), microwave excitation surface wave plasma (SWP), electron cyclotron resonance plasma (ECRP), helicon wave excitation plasma (HWP), or the like, may be used.

Figure 7A:
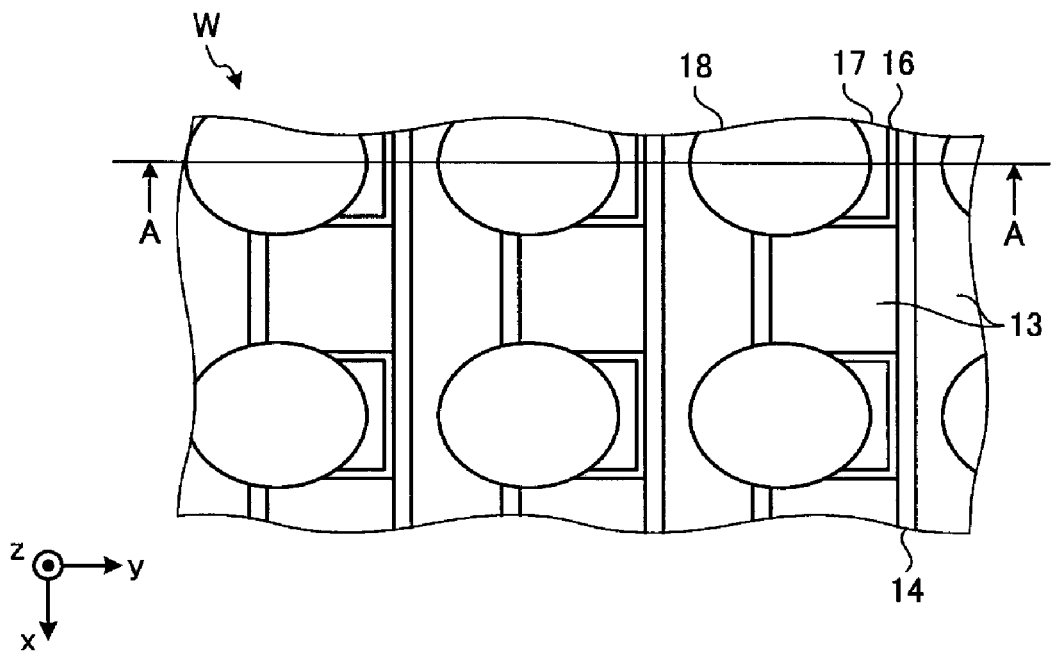
FIG. 7A is a top view illustrating an example of a wafer used for manufacturing a semiconductor device according to an embodiment of the present disclosure.
Figure 7B:
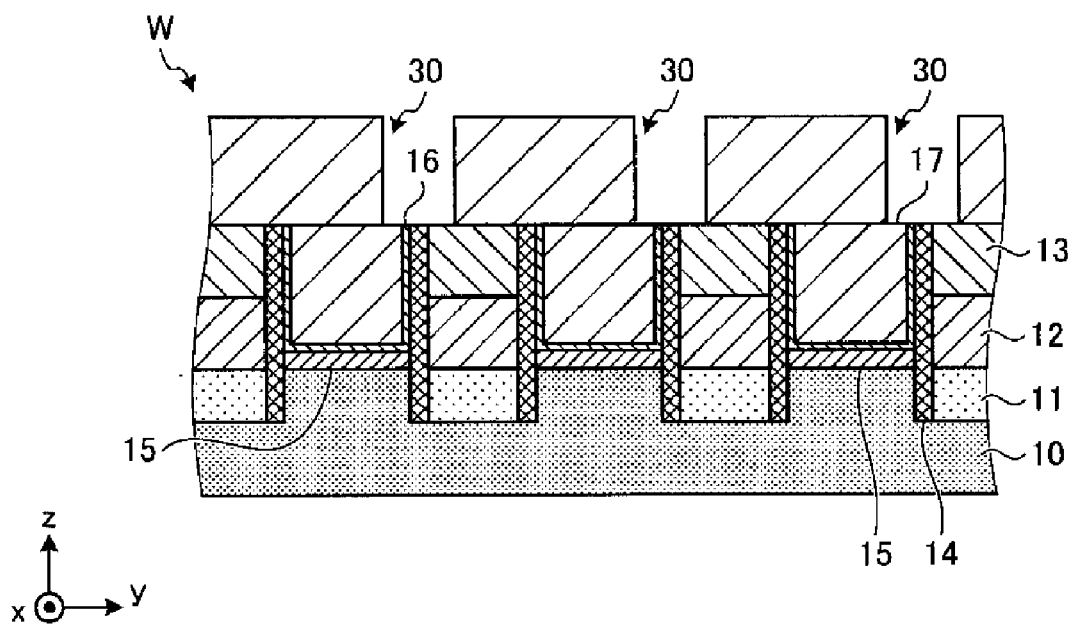
FIG. 7B is a cross-sectional view taken along line A-A, illustrating an example of the wafer used for manufacturing a semiconductor device according to an embodiment of the present disclosure.

Subsequently, the surface of the wafer W is flattened through CMP or the like (S16). Then, the second mask film 22 and the etching stop film 23 are removed through a dry etching method or the like using plasma (S17). Step S17 is an example of a removing step. Etching conditions for removing the second mask film 22 and the etching stop film 23 are the same as those described in step S14. As a result, as illustrated in FIGS. 7A and 7B, for example, the conductive material 18 that functions as a contact pad is formed on the wafer W. FIG. 7A is a top view illustrating an example of the wafer W used for manufacturing a semiconductor device according to an embodiment of the present disclosure, and FIG. 7B is a cross-sectional view taken along line A-A in FIG. 7A.

[Test Results]

Figure 8:
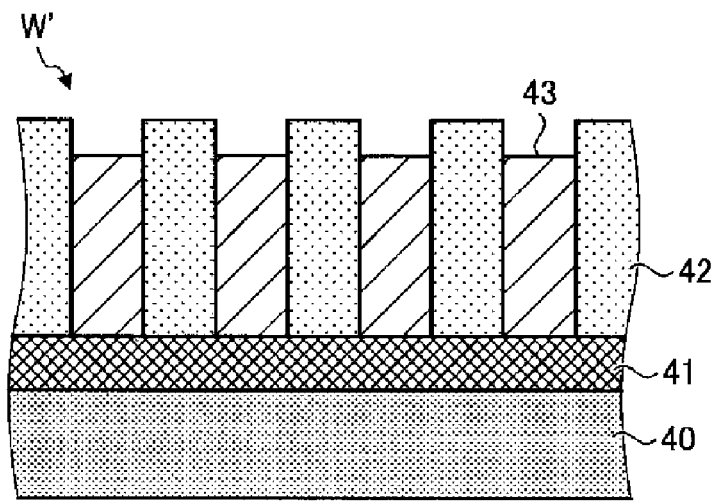
FIG. 8 is a cross-sectional view illustrating an example of a wafer used in a test.

Next, the test results regarding the selective growth of tungsten will be described. FIG. 8 is a cross-sectional view illustrating an example of the wafer W' used in the test. The wafer W' illustrated in FIG. 8 has a substrate 40, an underlying film 41, and a silicon oxide film 42. A plurality of grooves are formed in the silicon oxide film 42, and the underlying film 41 is exposed in the bottoms of the grooves. Using the wafer W' illustrated in FIG. 8, a test was conducted in which a tungsten film 43 was laminated on the underlying film 41 by alternately repeating a CVD method and a dry etching method using plasma. As the underlying film 41, a silicon nitride film, a silicon oxide film, a tungsten film, or a titanium nitride film was used.

Figure 9:
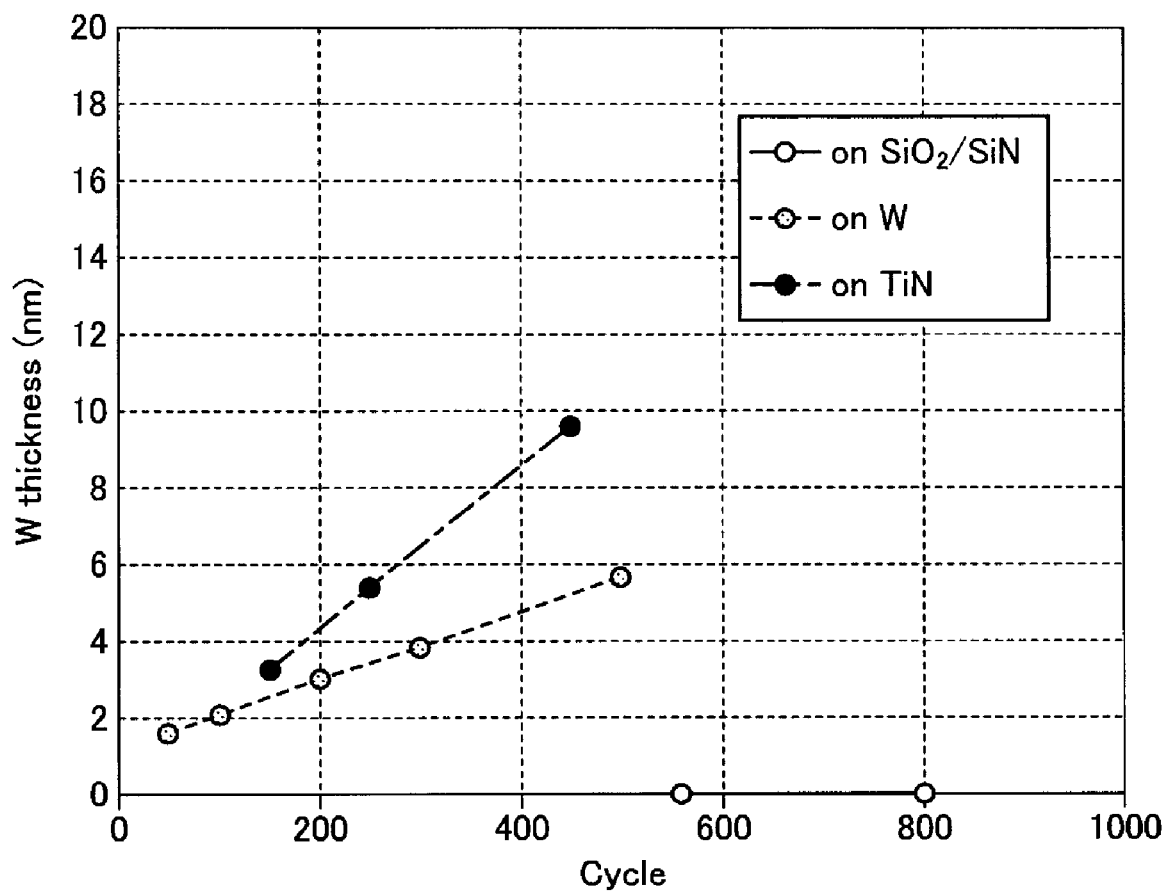
FIG. 9 is a view showing an example of test results.

FIG. 9 is a view illustrating an example of test results. For example, as illustrated in FIG. 9, when the underlying film 41 was the silicon nitride film or the silicon oxide film, no tungsten film 43 was laminated on the underlying film 41 even if the cycle including the CVD method and the dry etching method was repeated. Meanwhile, when the underlying film 41 was the tungsten film or the titanium nitride film, the tungsten film 43 was laminated on the underlying film 41, and the thickness of the tungsten film 43 was increased according to the number of cycles, each including the CVD method and the dry etching method.

Therefore, by repeating the cycle including the CVD method and the dry etching method, it is possible to achieve so-called selective growth in which the tungsten film does not grow on the silicon nitride film and the silicon oxide film, but grows on the tungsten film and the titanium nitride film.

Here, in step S15 of FIG. 1, the conductive material 18, which is tungsten, is laminated in each hole 31 by repeating the cycle including the CVD method and the dry etching method (see FIGS. 6A and 6B). At this time, the conductive material 18 grows on the conductive material 17, which is tungsten, and the barrier film 16, which is titanium nitride, through the selective growth. Meanwhile, the conductive material 18 does not grow on the second mask film 22, which is a silicon oxide film, on the insulating film 13, which is a silicon nitride film, and on the spacer 14 including the silicon oxide film and the silicon nitride film.

In addition, since the conductive material 18 is selectively grown on the conductive material 17 embedded in each hole 30, the conductive material 18 and the conductive material 17 embedded in each hole 30 are brought into close contact with each other. As a result, since a resistance value between the conductive material 18 and the conductive material 17 embedded in each hole 30 is reduced, it is possible to reduce the delay of a signal flowing between the conductive material 18 and the conductive material 17 embedded in each hole 30.

In addition, the conductive material 18 does not grow on the insulating film 13 and the spacer 14 including a silicon oxide film and a silicon nitride film. As a result, the tungsten atoms in the conductive material 18 do not reach the insulating film 13 and the spacer 14, which prevents the occurrence of metal contamination in which the tungsten atoms infiltrate into the insulating film 13 and the spacer 14.

Comparative Example

Next, a procedure of manufacturing a semiconductor device in a comparative example will be described with reference to FIGS. 10A to 13B. In the procedure of manufacturing a semiconductor device in the comparative example, first, for example, a wafer W'" having the same structure as the wafer W illustrated in FIGS. 2A and 2B is provided.

Figure 10A:
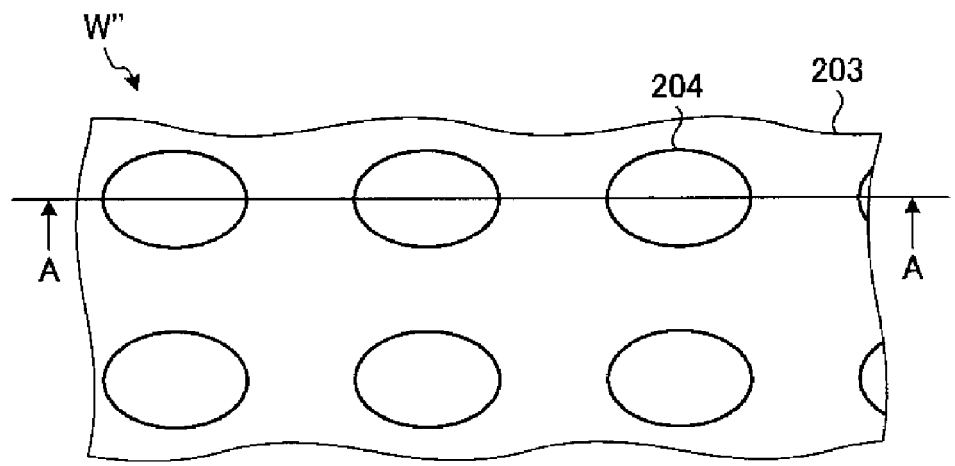
FIG. 10A is a top view illustrating an example of a wafer used for manufacturing a semiconductor device in a comparative example.
Figure 10B:
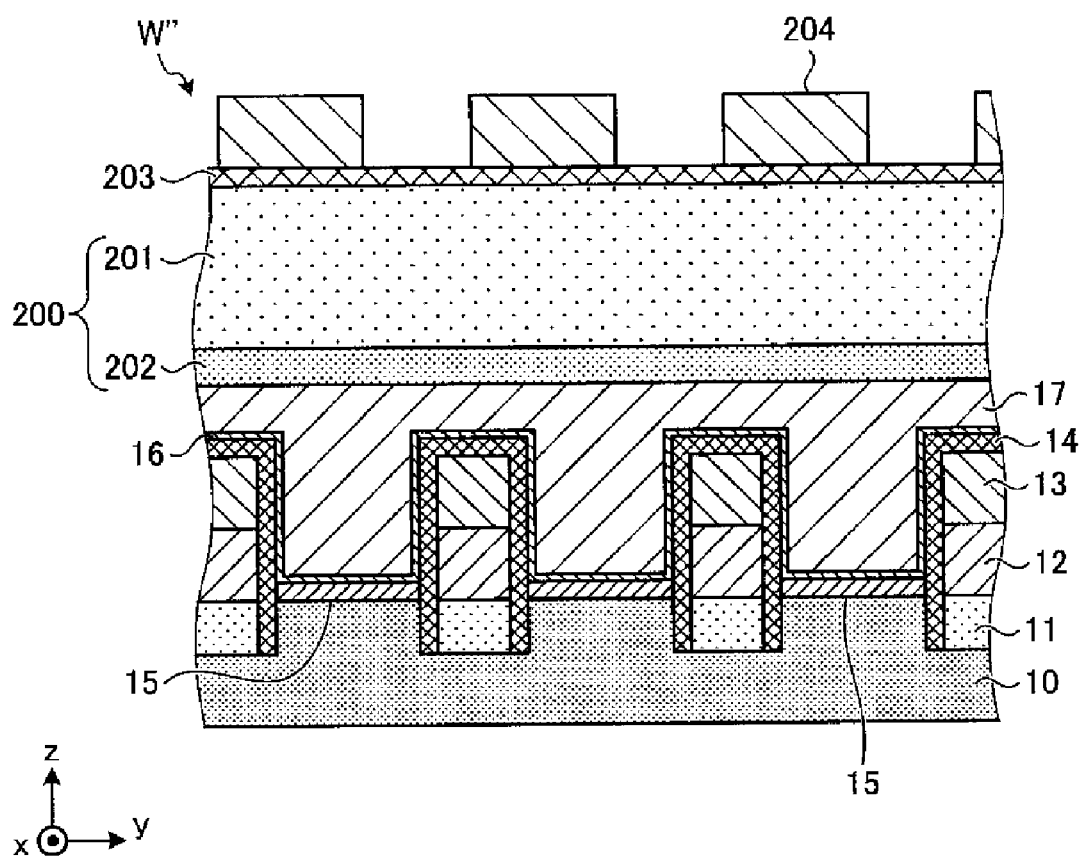
FIG. 10B is a cross-sectional view taken along line A-A, illustrating an example of the wafer used for manufacturing a semiconductor device in a comparative example.

Subsequently, a mask film 200 is laminated on the wafer W'". An antireflection film 203 is laminated on the mask film 200, and a resist 204 is laminated on the antireflection film 203. The antireflection film 203 is, for example, a silicon oxynitride film. The resist 204 is a material used for negative tone development (NTD) using EUV light, and is made of a material containing a metal. Then, for example, as illustrated in FIGS. 10A and 10B, the resist 204 is patterned through PTD using EUV light. FIG. 10A is a top view illustrating an example of the wafer W'" used for manufacturing a semiconductor device in the comparative example, FIG. 10B is a cross-sectional view taken along line A-A in FIG. 10A.

In the comparative example, the mask film 200 includes a first mask film 201 and a second mask film 202. The first mask film 201 is, for example, an amorphous carbon film. The second mask film 202 is, for example, a silicon nitride film. In addition, in the comparative example, for example, as illustrated in FIGS. 10A and 10B, the resist 204 is patterned so as to have a shape corresponding to the shape of the contact pad.

Figure 11A:
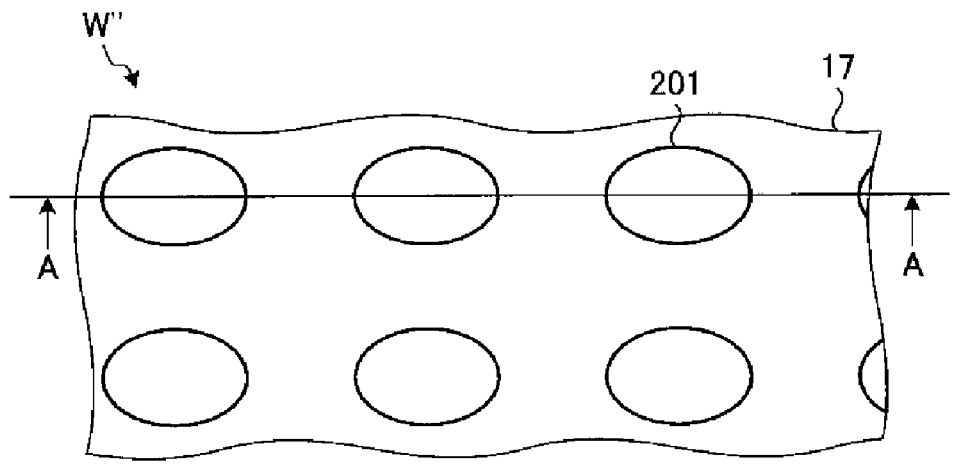
FIG. 11A is a top view illustrating an example of a wafer used for manufacturing a semiconductor device in a comparative example.
Figure 11B:
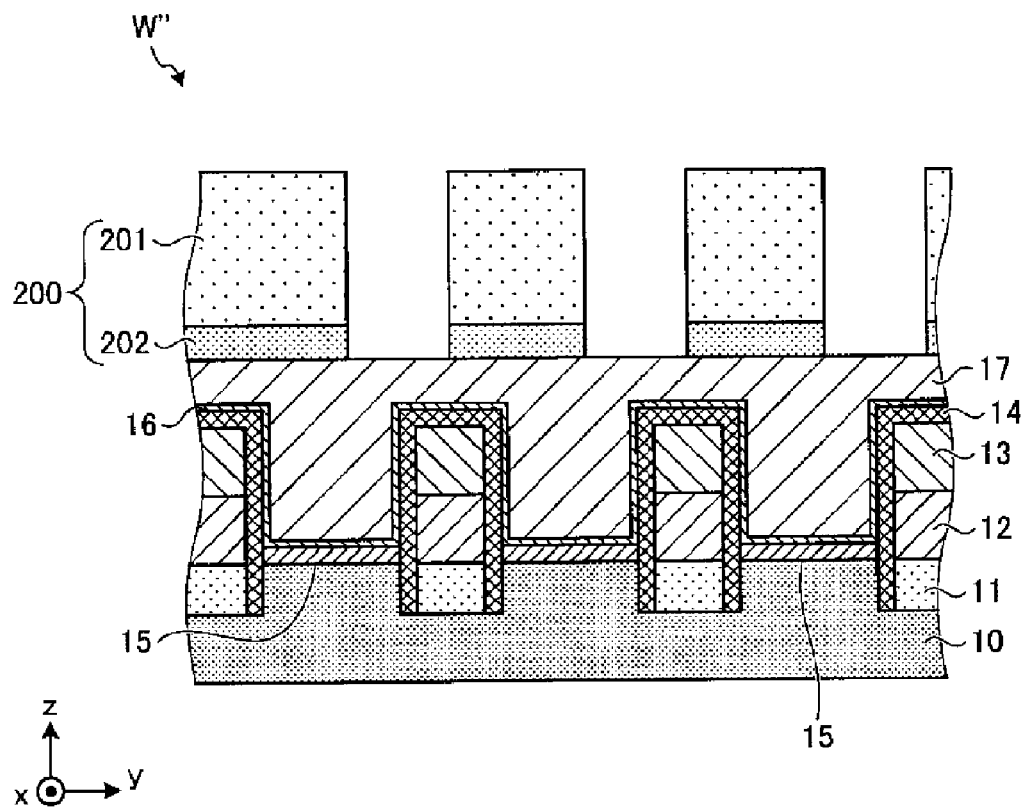
FIG. 11B is a cross-sectional view taken along line A-A, illustrating an example of the wafer used for manufacturing a semiconductor device in a comparative example.

Subsequently, the antireflection film 203 and the first mask film 201 are etched using the resist 204 as a mask, and the second mask film 202 is etched using the etched first mask film 201 as a mask. The etching of the first mask film 201 and the second mask film 202 is performed through, for example, a dry etching method using plasma. As a result, the wafer W'" is in, for example, the state illustrated in FIGS. 11A and 11B. FIG. 11A is a top view illustrating an example of the wafer W'" used for manufacturing a semiconductor device in the comparative example, and FIG. 11B is a cross-sectional view taken along line A-A in FIG. 11A.

Figure 12A:
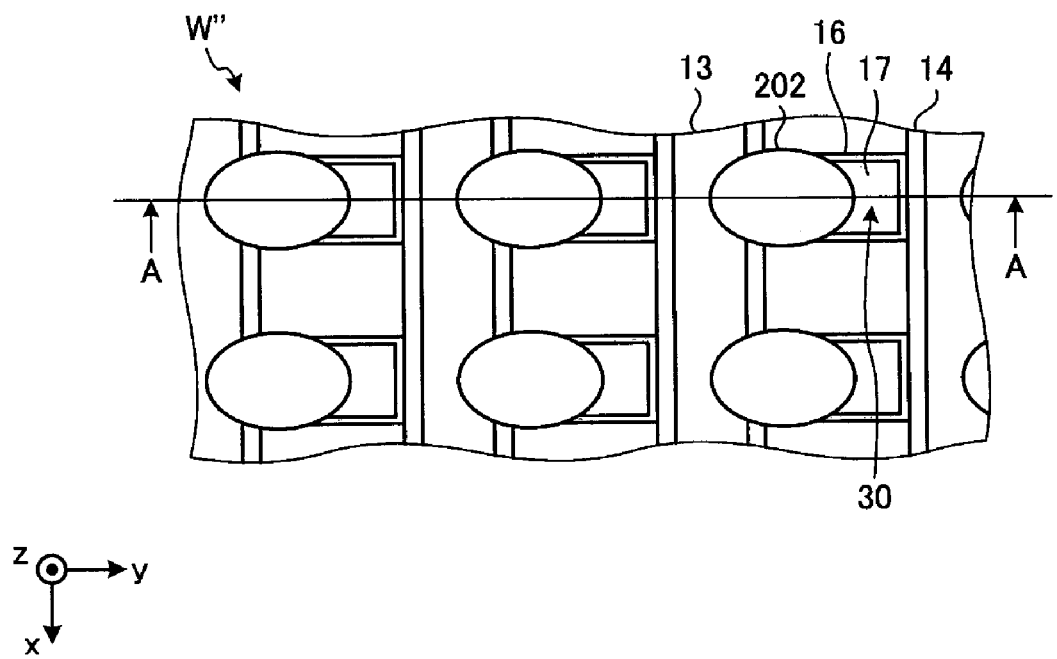
FIG. 12A is a top view illustrating an example of a wafer used for manufacturing a semiconductor device in a comparative example.
Figure 12B:
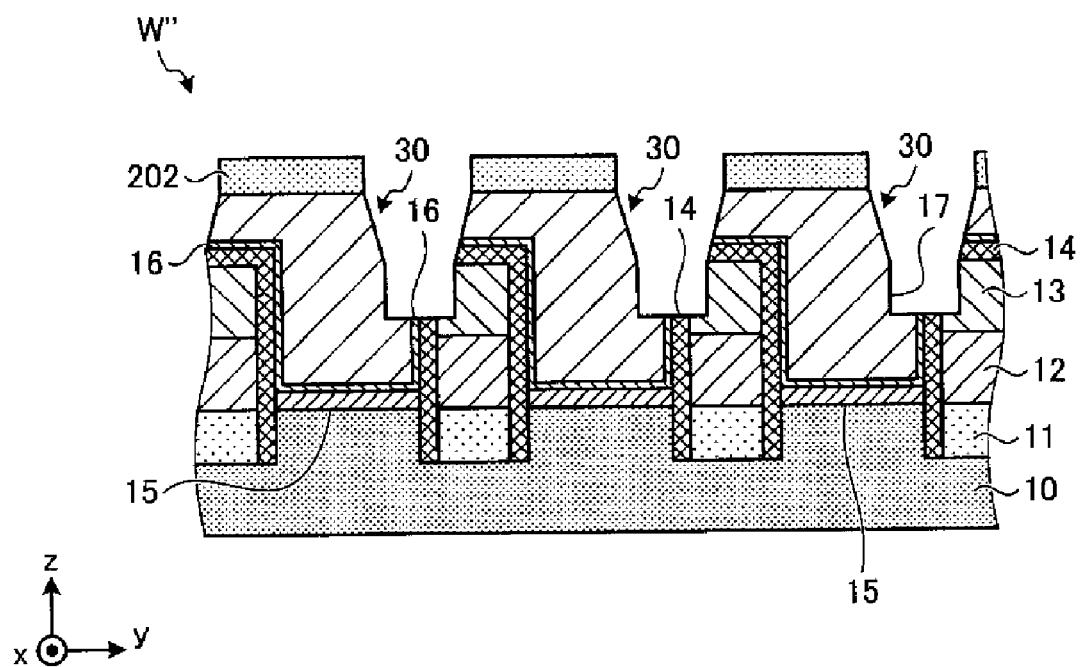
FIG. 12B is a cross-sectional view taken along line A-A, illustrating an example of the wafer used for manufacturing a semiconductor device in a comparative example.

Subsequently, the barrier film 16 and the conductive material 17 are etched using the first mask film 201 and the second mask film 202 as masks. The etching of the barrier film 16 and the conductive material 17 is performed through, for example, a dry etching method using plasma. As a result, the wafer W'" is in, for example, the state illustrated in FIGS. 12A and 12B. FIG. 12A is a top view illustrating an example of the wafer W'" used for manufacturing a semiconductor device in the comparative example, and FIG. 12B is a cross-sectional view taken along line A-A in FIG. 12A.

Figure 13A:
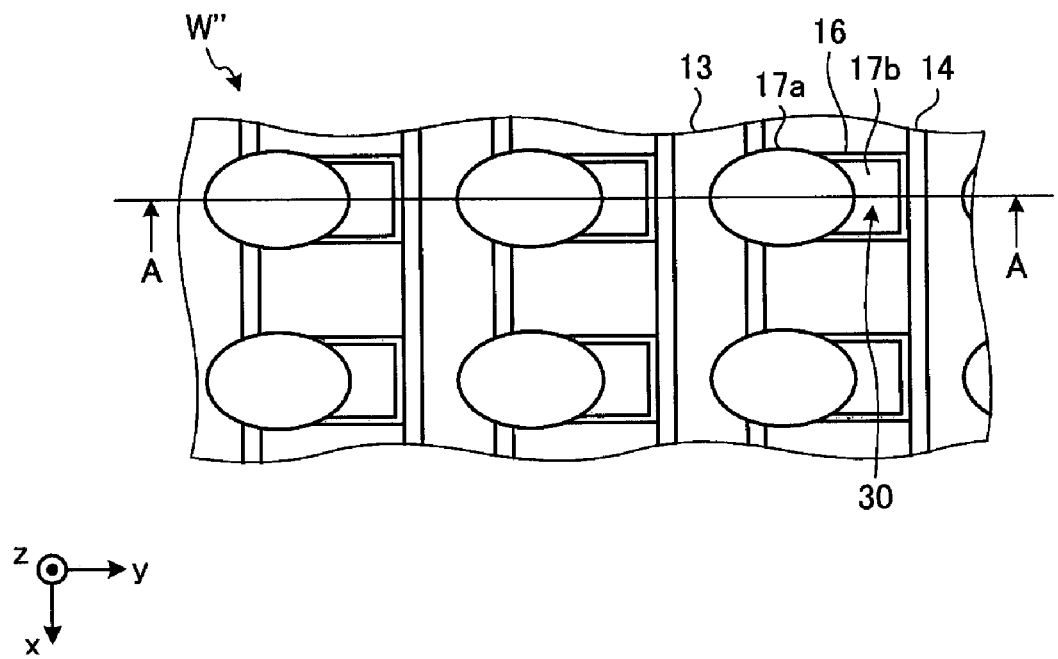
FIG. 13A is a top view illustrating an example of a wafer used for manufacturing a semiconductor device in a comparative example.
Figure 13B:
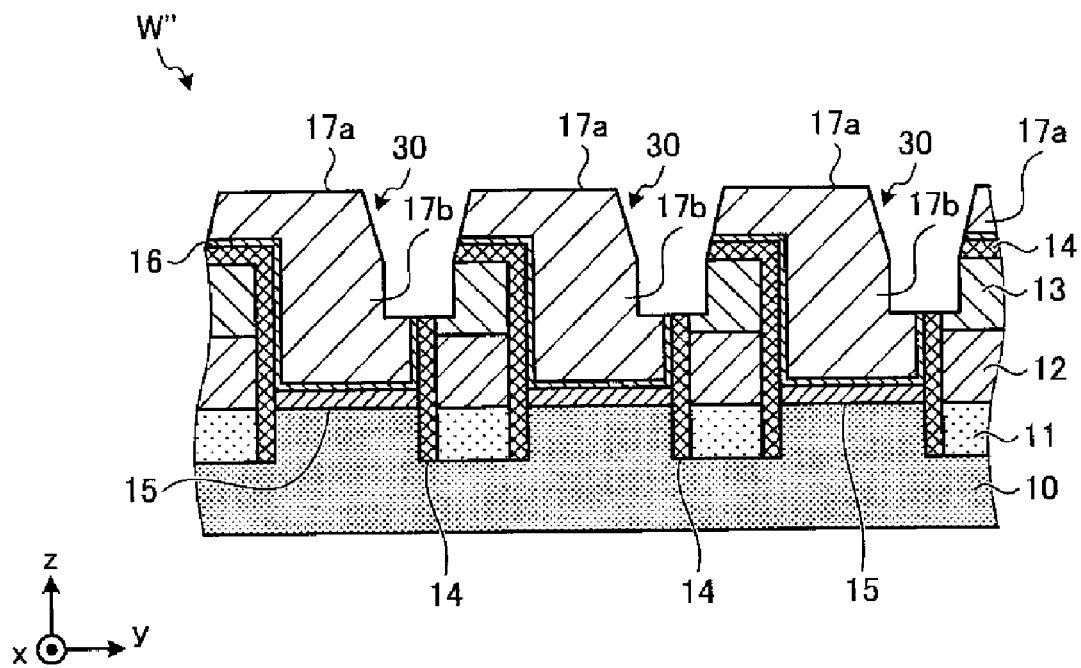
FIG. 13B is a cross-sectional view taken along line A-A, illustrating an example of the wafer used for manufacturing a semiconductor device in a comparative example.

Subsequently, the first mask film 201 and the second mask film 202 are removed through, for example, a dry etching method using plasma. As a result, the wafer W'" is in, for example, the state illustrated in FIGS. 13A and 13B. FIG. 13A is a top view illustrating an example of the wafer W'" used for manufacturing a semiconductor device in the comparative example, and FIG. 13B is a cross-sectional view taken along line A-A in FIG. 13A. In FIG. 13B, conductive materials 17*a* function as contact pads, and conductive materials 17*b* in the holes 30 function as contact plugs.

Here, in the wafer W'" in the comparative example illustrated in FIG. 13B, upper portions of the spacers 14 are scraped when the barrier film 16 and the conductive material 17 are etched. Therefore, thereafter, when an insulating film, such as a silicon nitride film, is laminated between the conductive materials 17*a*, the parasitic capacitance of the conductive materials 17*b* functioning as contact pads may increase. In addition, in the case in which the spacers 14 are air gaps sandwiched between the silicon nitride films, when an insulating film, such as a silicon nitride film, is laminated between the conductive materials 17*a*, the air gaps may be filled with the insulating film. As a result, the parasitic capacitance of the conductive materials 17*b* functioning as contact pads may further increase.

In addition, in the wafer W" in the comparative example illustrated in FIG. 13B, the conductive materials 17*b* are partially scraped by over-etching caused when the barrier film 16 and the conductive material 17 are etched, and the conductive materials 17*b* are partially thinned. When the conductive materials 17*b* are thinned, the resistance value of the conductive materials 17*b* increases. When the resistance value of the conductive materials 17*b* increases, the delay of a signal flowing through the conductive materials 17*b*, power consumption, and a calorific value increase.

In contrast, in the wafer W of the present embodiment, the spacers 14 are hardly etched under the conditions when the etching stop film 23 is removed through etching (see FIG. 5B). Therefore, the parasitic capacitance of the conductive material 17 embedded in the holes 30 and functioning as contact plugs is suppressed to be low by the spacers 14.

In addition, in the conductive material 17 in the holes 30, which functions as contact plugs in the wafer W of the present embodiment, the etching stop film 23 is hardly etched under the conditions when it is removed through etching (see FIG. 5B). Therefore, the contact plugs are not scraped in a direction along the x-y plane, and the resistance value of the contact plugs does not increase. Therefore, the delay of a signal flowing through the conductive material 17 functioning as the contact plugs, the power consumption, and the increase in the calorific value are suppressed.

In the comparative example, it is necessary to form a thick hard mask in order to etch the conductive materials 17*b* to be formed as contact pads. If the hard mask is thick, it is difficult to maintain the accuracy of the shape patterned through etching. In contrast, in the present embodiment, the conductive materials 17 to be formed as contact pads are formed by being laminated in the holes 31 formed in conformity to the shape of the contact pads. Therefore, since it is not necessary to etch the conductive material 17, it is possible to thin the mask film. As a result, it is easy to maintain the accuracy of the shape patterned through etching.

In addition, in the semiconductor device manufacturing method in the comparative example, the resist 204 is made of a material used for NTD using EUV light and contains a metal. Meanwhile, the resist 25 in the present embodiment is made of a material used for PTD using EUV light, and does not contain a metal. Therefore, since the resist 25 is capable of forming a predetermined pattern with a smaller exposure amount than that of the resist 204, it is possible to shorten the exposure time. As a result, it is possible to reduce the time required for manufacturing a semiconductor device.

Specifically, in the semiconductor device manufacturing method in the present embodiment, the time required for forming the contact pads is reduced by about 40% compared with the comparative example. As a result, in the semiconductor device manufacturing method in the present embodiment, the number of semiconductor devices that can be manufactured per unit time is about 1.7 times that in the comparative example. Therefore, with the semiconductor device manufacturing method in the present embodiment, it is possible to improve the productivity of semiconductor devices compared with the comparative example.

An embodiment has been described above. As described above, the semiconductor device manufacturing method in the present embodiment includes the planarizing step, the laminating step, the hole forming step, the embedding step, and the removing step. In the planarizing step, the surface of the wafer W in which the conductive material 17 is embedded in the hole 30 is planarized so as to expose the conductive material 17 embedded in the hole 30, wherein the hole 30 is formed in a region on the insulating film 13 laminated on the wafer W and surrounded by the spacer 14. In the laminating step, the mask film 20 is laminated on the surface of the wafer W. In the hole forming step, the hole 31 is formed in the mask film 20 such that at least a portion of the upper surface of the conductive material 17 embedded in the hole 30 is exposed. In the embedding step, the conductive material 18 is embedded in the hole 31. In the removing step, the mask film 20 is removed. As a result, it is possible to process a semiconductor device having a small signal delay with high accuracy, and to improve the productivity of the semiconductor device.

Further, in the above-described embodiment, the conductive material is tungsten. This makes it possible to form a contact pad on a contact plug.

In the embodiment described above, in the embedding step, the conductive material 18 is embedded in the hole 31 through the selective growth in which the conductive material 18 is laminated on the conductive material 17 but is not laminated on the insulating film 13. This makes it possible to easily form a contact pad on a contact plug.

In addition, in the aforementioned embodiment, in the embedding step, the supplying the tungsten-containing gas to the surface of the wafer W and the supplying plasma of the hydrogen-containing gas to the surface of the wafer W are alternately repeated. This makes it possible to selectively grow the conductive material 18 on the conductive material 17.

In addition, in the embodiment described above, the tungsten-containing gas is a $WCl_5$ gas, a $WCl_6$ gas, or a $WF_6$ gas, and the hydrogen-containing gas is a $H_2$ gas or a $SiH_4$ gas. This makes it possible to selectively grow the conductive material 18 on the conductive material 17.

Further, in the embodiment described above, the hole forming step includes laminating the resist 25 on the mask film 20, forming the opening in the resist 25 in conformity to the shape of the hole 31 through PTD using EUV light, and forming the hole 31 in the mask film 20 by etching the mask film 20 using the resist 25 having therein the formed opening as a mask. This makes it possible to reduce the exposure time compared to the case in which the resist is patterned through NTD using EUV light.

[Others]

The technology disclosed in the present application is not limited to the above-described embodiment, and various modifications are possible within the scope of the gist thereof.

For example, in the embodiment described above, in step S15, the conductive material 18 is laminated in the hole 31 through the selective growth, but the technique disclosed herein is not limited thereto. For example, after the insulating film 13 and the spacer 14 in the hole 31 are protected by the barrier film 16, the conductive material 18 may be laminated in the hole 31 through, for example, CVD or the like. Even in this way, it is also possible to laminate the conductive material 18 to be formed as a contact pad on the conductive material 17 in the hole 30.

In addition, in the embodiment described above, the resist 25 is patterned using EUV light, but the technique disclosed herein is not limited thereto. The resist 25 may be patterned using ArF excimer laser light or the like. In the case in which the resist 25 is patterned using the ArF excimer laser light or the like, the resist 25 may be made of a material suitable for patterning using the ArF excimer laser light.

According to various aspects and embodiments of the present disclosure, it is possible to produce a semiconductor device having a small signal delay and to improve the productivity of the semiconductor device.

It shall be understood that the embodiments disclosed herein are illustrative and are not restrictive in all aspects. Indeed, the above-described embodiments can be implemented in various forms. The embodiments described above may be omitted, replaced, or modified in various forms without departing from the scope and spirit of the appended claims.

What is claimed is:

1. A method of manufacturing a semiconductor device, the method comprising:
   planarizing a surface of a substrate having a conductive material, which is tungsten, embedded in a first hole so as to expose the conductive material embedded in the first hole, wherein the first hole is formed in a region which is on an insulating film laminated on the substrate and is surrounded by a spacer film;
   laminating a mask film on the surface of the substrate;
   forming a second hole in the mask film such that at least a portion of an upper surface of the conductive material embedded in the first hole is exposed;
   embedding the conductive material in the second hole; and
   removing the mask film,
   wherein, in the embedding the conductive material in the second hole, the conductive material is embedded in the second hole through a selective growth in which lamination is performed on the conductive material and is not performed on the insulating film.

2. The method of claim 1, wherein the embedding the conductive material in the second hole includes alternately repeating supplying a tungsten-containing gas to the surface of the substrate, and supplying plasma of a hydrogen-containing gas to the surface of the substrate.

3. The method of claim 2, wherein the tungsten-containing gas is a $WCl_5$ gas, a $WCl_6$ gas, or a $WF_6$ gas, and the hydrogen-containing gas is a $H_2$ gas or a $SiH_4$ gas.

4. The method of claim 1, wherein the forming the second hole includes:
   laminating a resist on the mask film;
   forming an opening in the resist in conformity to a shape of the second hole through a positive tone development (PTD) using an extreme ultraviolet lithography (EUV) light; and
   forming the second hole in the mask film by etching the mask film using the resist, in which the opening is formed, as a mask.

5. A method of manufacturing a semiconductor device, the method comprising:
   forming a mask film on an insulating film and a conductive material, which is tungsten, provided in a first hole formed in the insulating film;
   removing a portion of the mask film to form a second hole through which a portion of the insulating film and a portion of the conductive material are exposed;
   forming the conductive material in the second hole; and
   removing the mask film after forming the conductive material in the second hole,
   wherein, in the forming the conductive material in the second hole, the conductive material is formed in the second hole through a selective growth in which lamination is performed on the conductive material and is not performed on the insulating film.

6. The method of claim 5, wherein the conductive material in the second hole is formed by alternately repeating supplying a tungsten-containing gas and supplying a hydrogen-containing gas.

7. The method of claim 5, wherein the insulating film is a silicon nitride film.

* * * * *